(12) United States Patent
Alasirniö

(10) Patent No.: US 10,438,984 B2
(45) Date of Patent: Oct. 8, 2019

(54) OPTOELECTRONIC MODULE WITH CUSTOMIZABLE SPACERS

(71) Applicant: ams Sensors Singapore Pte. Ltd., Singapore (SG)

(72) Inventor: Jukka Alasirniö, Jääli (FI)

(73) Assignee: ams Sensors Singapore Pte. Ltd., Singapore (SG)

( * ) Notice: Subject to any disclaimer, the term of this patent is extended or adjusted under 35 U.S.C. 154(b) by 0 days.

(21) Appl. No.: 15/958,494

(22) Filed: Apr. 20, 2018

(65) Prior Publication Data

US 2018/0240824 A1  Aug. 23, 2018

Related U.S. Application Data

(63) Continuation of application No. 15/232,932, filed on Aug. 10, 2016, now abandoned.

(60) Provisional application No. 62/204,747, filed on Aug. 13, 2015.

(51) Int. Cl.
*H01L 27/146* (2006.01)
*H01L 31/0232* (2014.01)
*H04N 5/225* (2006.01)
*H01L 27/148* (2006.01)

(52) U.S. Cl.
CPC .... *H01L 27/1463* (2013.01); *H01L 27/14618* (2013.01); *H01L 27/14625* (2013.01); *H01L 31/02325* (2013.01); *H04N 5/2254* (2013.01); *H04N 5/2257* (2013.01); *H01L 27/14621* (2013.01); *H01L 27/14643* (2013.01); *H01L 27/14806* (2013.01)

(58) Field of Classification Search
CPC .......... H01L 27/1463; H01L 27/14618; H01L 27/14625; H01L 27/14621; H01L 27/14643; H01L 27/14806; H01L 31/02325; H04N 5/2254; H04N 5/2257
See application file for complete search history.

(56) References Cited

U.S. PATENT DOCUMENTS

| | | |
|---|---|---|
| 2003/0059178 A1 | 3/2003 | Kobayashi et al. |
| 2005/0163016 A1* | 7/2005 | Kimura ................ G02B 13/001 369/112.01 |
| 2011/0050979 A1 | 3/2011 | Rudmann |
| 2014/0125849 A1* | 5/2014 | Heimgartner ..... H01L 27/14625 348/276 |

(Continued)

FOREIGN PATENT DOCUMENTS

| | | |
|---|---|---|
| WO | WO 2013/091829 | 6/2013 |
| WO | WO 2015/126328 | 8/2015 |
| WO | WO 2016/013978 | 1/2016 |

*Primary Examiner* — Mark W Tornow
(74) *Attorney, Agent, or Firm* — Michael Best & Friedrich LLP

(57) ABSTRACT

The disclosure describes customizable optoelectronic modules and methods for standardizing a plurality of the customizable optoelectronic modules. The customizable optoelectronic modules can be configured to mitigate dimensional variations and misalignments in a number of their respective constituent components such as optical assemblies and sensor covers. The customizable optoelectronic modules and methods for standardizing a plurality of the customizable optoelectronic modules can obviate the need for binning during manufacturing thereby saving considerable resources such as time and expense.

19 Claims, 13 Drawing Sheets

(56) References Cited

U.S. PATENT DOCUMENTS

2014/0361200 A1* 12/2014 Rudmann ............. H01L 23/053
                                                    250/578.1
2016/0306265 A1* 10/2016 Riel ........................ G02B 7/02
2017/0012069 A1*  1/2017 Rudmann ......... H01L 27/14618

* cited by examiner

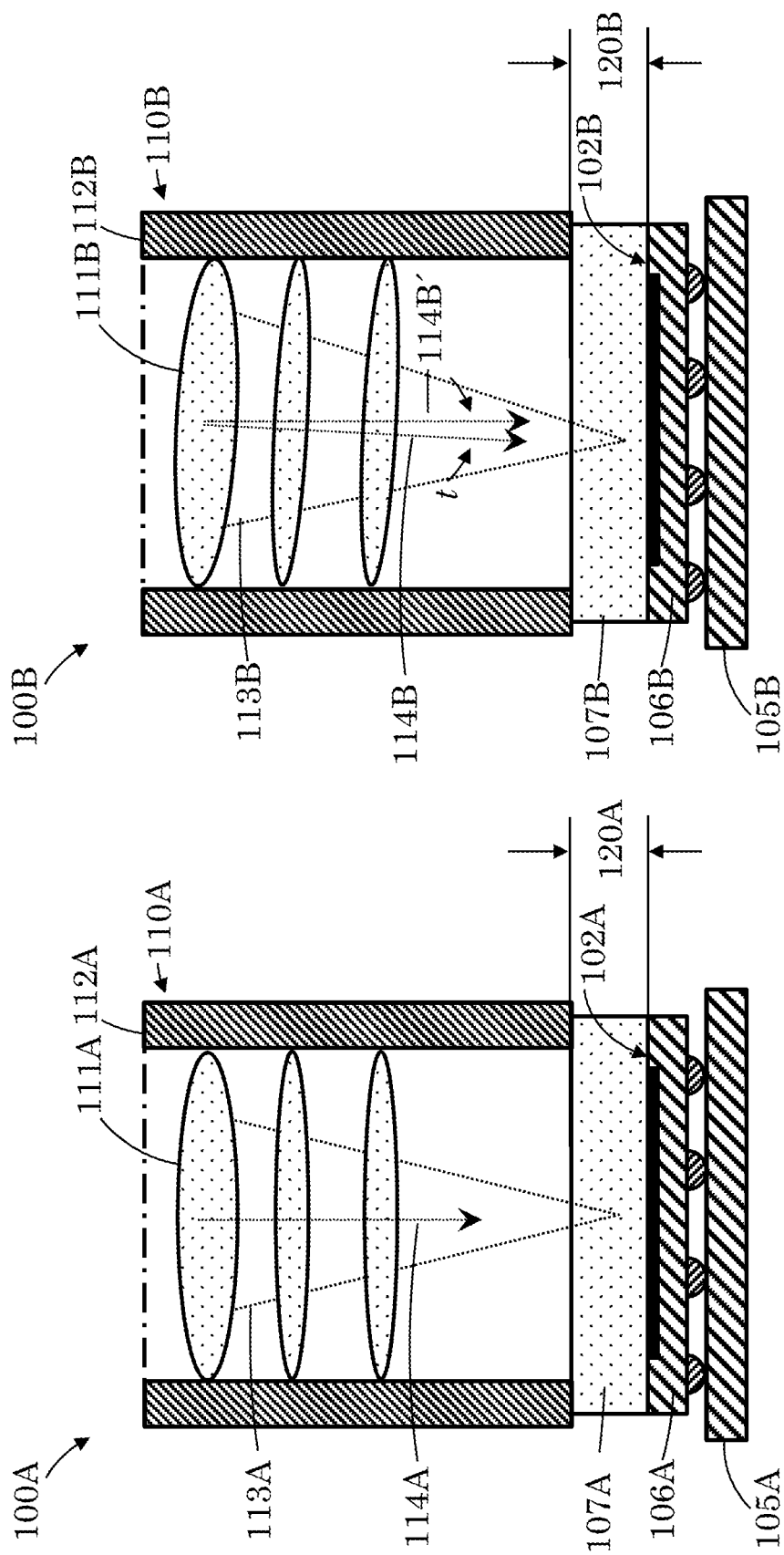

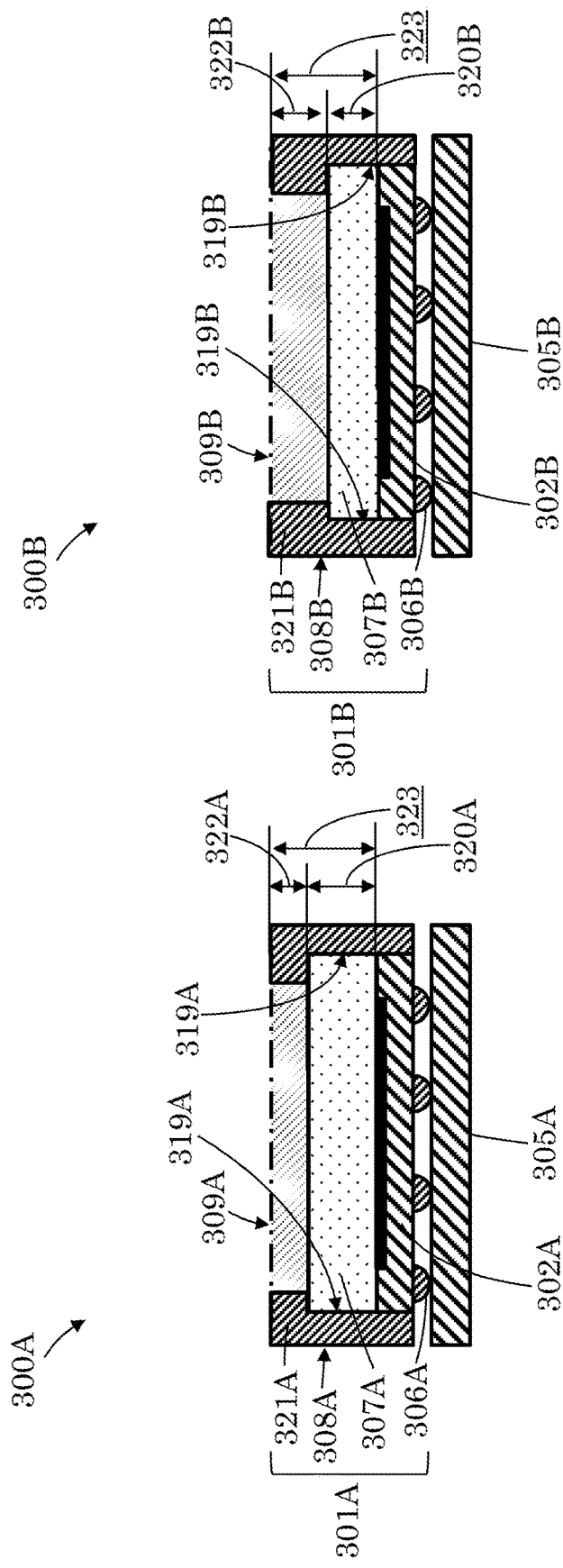

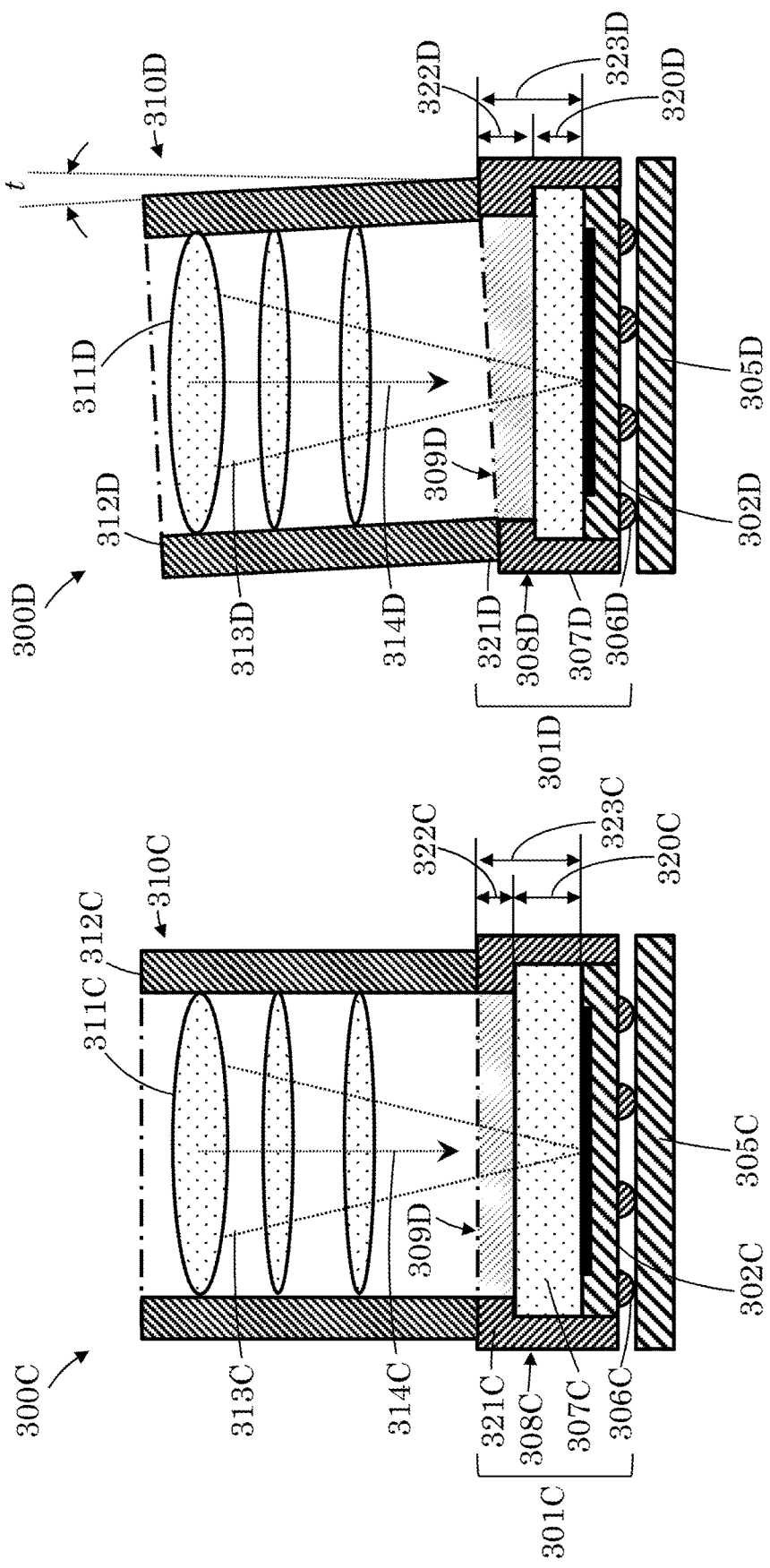

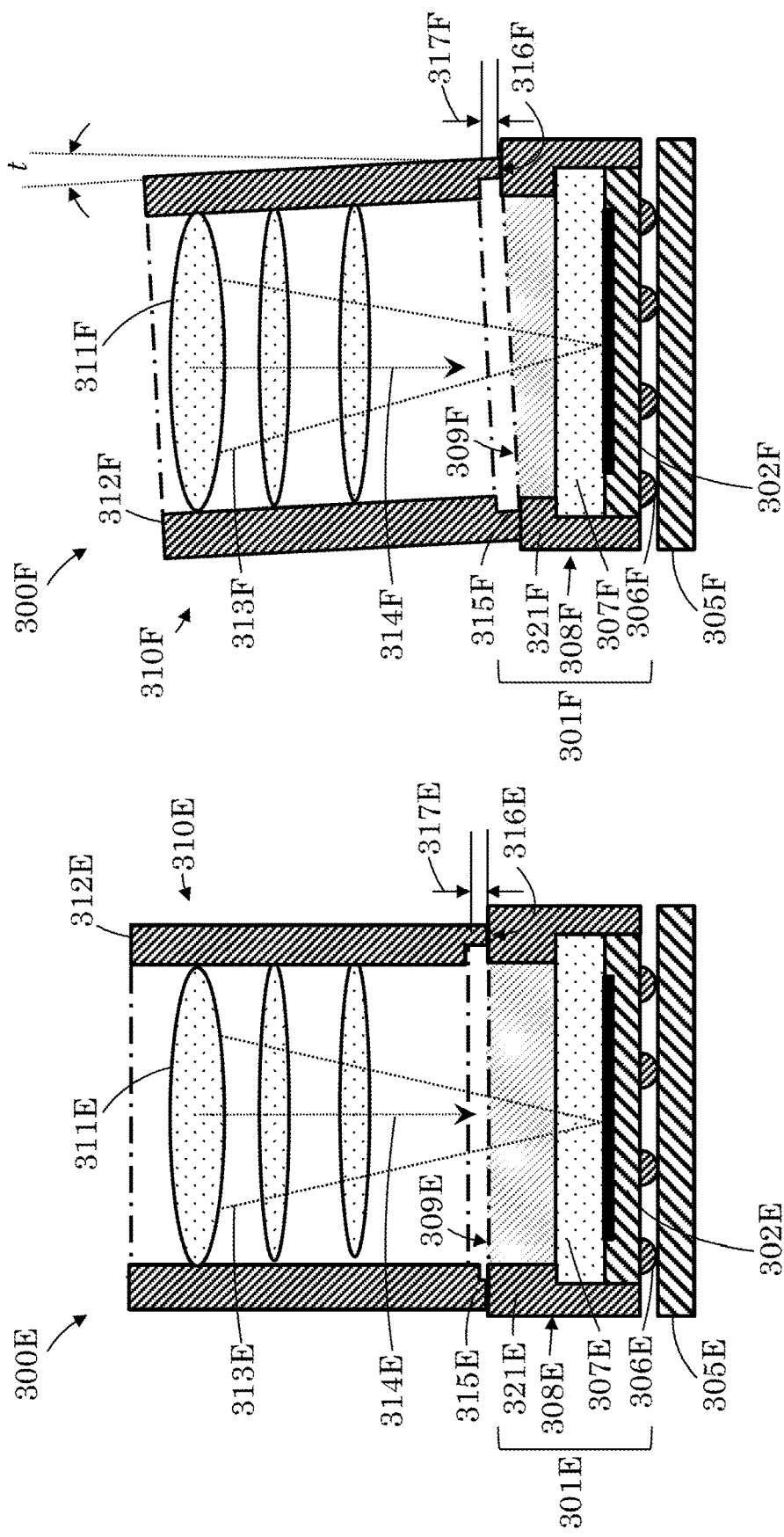

OPTOELECTRONIC MODULE WITH CUSTOMIZABLE SPACERS

CROSS-REFERENCE TO RELATED APPLICATION(S)

This application is a continuation of U.S. application Ser. No. 15/232,932, filed on Aug. 10, 2016, which claims the benefit of priority U.S. Application No. 62/204,747, filed on Aug. 13, 2015. The disclosures of the prior applications are incorporated herein by reference.

TECHNICAL FIELD

This disclosure relates to optoelectronic modules with customizable features.

BACKGROUND

Optoelectronic modules include multiple components (such as transparent covers, optical filters, and lens or optical assemblies). Optoelectronic modules are often manufactured from mass-produced components. Due to manufacturing tolerances, or other fabrication variations, these mass-produced components can have variable dimensions, while in other cases ostensibly identical lens or optical assemblies can in fact possess variable focal lengths or tilted optical axes. Components with variable dimensions can cause significant problems in optoelectronic modules whose optimal optical performance requires tight tolerances (e.g., optoelectronic modules with high-resolution sensors).

In some cases components that exhibit dimensional variation may be matched (i.e., binned) to other components with complementing dimensional variations. However, this binning process is accomplished only with considerable time and expense.

SUMMARY

The present disclosure describes customizable optoelectronic modules and methods of fabricating the customizable optoelectronic modules. Various approaches are described to provide adjustments to reduce dimensional variations of various components (such as transparent covers, optical filters, and optical assemblies) from component to component, and in some cases within components. For example, approaches are described to reduce the occurrence of tilt of the optical assemblies and/or optical elements. The described implementations obviate the need for binning of components when manufacturing optoelectronic modules.

For example, in a first implementation a customizable optoelectronic module includes a substrate on which is electrically mounted a sensor, a cover having a first thickness disposed over the sensor, a customizable spacer assembly including a customizable spacer laterally surrounding a peripheral surface of the cover, and a spacer extension extending from the customizable spacer with a second thickness having a terminal defining a customizable spacer surface.

In some cases, other implementations can include an optical filter of a thickness, the first thickness including the thickness of the optical filter and the thickness of the cover. While other implementations can include an optical assembly, the optical assembly including a plurality of optical elements mounted within an optical housing. In this implementation the optical assembly has a focal length and an optical axis where the customizable spacer surface is modifiable such that the focal length is incident on the sensor.

Further, in other implementations, methods are described for standardizing a plurality of customizable optoelectronic modules. In an example implementation, a plurality of customizable optoelectronic modules, wherein each customizable optoelectronic module comprising the plurality of customizable optoelectronic modules includes a substrate on which is electrically mounted a sensor, a cover having a first thickness disposed over the sensor, a customizable spacer assembly having a customizable spacer laterally surrounding a peripheral surface of the cover, and a spacer extension extending from the customizable spacer with a second thickness having a terminal end defining a customizable spacer surface is provided. Further, a value of each first thickness of each customizable optoelectronic module comprising the plurality of optoelectronic modules is determined. Further, a data set of values, wherein the data set associates each first thickness with each respective customizable optoelectronic module is compiled. Finally, the customizable spacer surface of each respective customizable optoelectronic module according to the data set such that the sum of each second thickness and each respective first thickness is substantially equal to a first standard value, the first standard value being substantially the same for each customizable optoelectronic module is modified.

In the following description, reference is made to the accompanying drawings that form a part hereof, and in which is shown by way of illustration specific embodiments which may be practiced. These embodiments are described in sufficient detail to enable those skilled in the art to practice the invention, and it is to be understood that other embodiments may be utilized and that structural changes may be made without departing from the scope of the present invention. The following description of example embodiments is, therefore, not to be taken in a limited sense, and the scope of the present invention is defined by the appended claims.

BRIEF DESCRIPTION OF THE DRAWINGS

FIG. 2A and FIG. 2B depict example optoelectronic modules with optical assemblies that are not focused on their respective sensors.

FIG. 3A-FIG. 3F depict example optoelectronic modules with customizable spacers configured to focus optical assemblies on their respective sensors.

DETAILED DESCRIPTION

Figure 1:
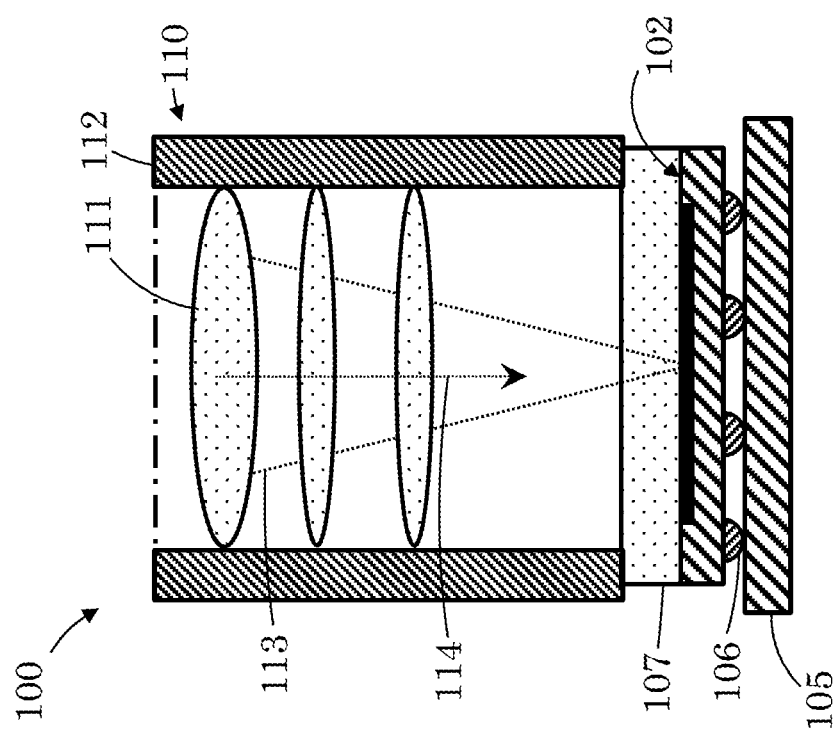
FIG. 1 depicts an example of an optoelectronic module with an optical assembly that is focused on a sensitive area of a sensor.

FIG. 1 depicts an example of an optoelectronic module 100 (e.g., an imaging module such as a camera) as discussed above. The optoelectronic module 100 can include a sensor 102 (e.g., a complementary metal-oxide semiconductor, charge-couple device or other pixel, e.g., modulation pixel, array). The sensor 102 is electrically coupled to a substrate 105 (e.g., a PCB) via electrical contacts 106 (such as wires, vias, solder bumps/bump-bonding). In some instances, e.g., when the sensor 102 is thin, a cover 107 can be located adjacent to the sensor 102 (i.e., for structural support and/or protection from dust and/or other particles that can arise, for example, during the manufacture and assembly of the optoelectronic module 100). The cover 107 can be a thin layer of glass, for example, or other highly transmissive optical polymer. In other instances, the transparent cover 107 can be implemented as a filter (e.g., an infrared pass filter, IR cut filter, or a filter that can be configured to pass or block any other wavelength or range of wavelengths). Still in other instances the transparent cover 107 can also be coated or partly coated (e.g., with a filter material such as a polymer and/or dielectric material). In such instances, the coated transparent cover 107 can pass and/or block any wavelength or range of wavelengths (such as infrared, ultraviolet, or wavelengths corresponding to red, green, blue or other visible colors). Still further, in such instances the transparent cover 107 can be partly coated with a plurality and/or array of coatings and/or a filter array (such as a color filter array). The optoelectronic module 100 further includes an optical assembly 110. The optical assembly 110 includes a plurality of optical elements 111 mounted and/or integrated into an optical housing 112. The optical elements 111 and their respective position can delineate a focal length 113 of the optical assembly 110 and an optical axis 114 (depicted in FIG. 1 as substantially orthogonal to the sensor 102). In some instances, for example, when manufacturing optoelectronic modules on the wafer level or a large scale, the thickness of the transparent cover 107 and/or variations in focal length 113 can vary from module to module (e.g., due to manufacturing tolerances). Such variations can result in optoelectronic modules with respective focal lengths that are not focused on their respective sensors. Further, the optical elements 111 can be mounted and/or integrated into an optical element housing 112 at a tilt with respect to a desired optical axis. Accordingly, the optical axis 114 can be tilted with respect to a desired optical axis. Both variations in focal length and/or optical-axis tilt (i.e., cant) give rise to an optical assembly that is not focused on its respective sensor 102; accordingly, these variations can give rise to reduced image quality and/or varying image quality from module to module. Examples of each variation are depicted in FIG. 2A and FIG. 2B, respectively.

FIG. 2A and FIG. 2B depict the aforementioned example variations that can occur in the example optoelectronic module depicted in FIG. 1. FIG. 2A depicts an optoelectronic module 100A. The optoelectronic module 100A can include a sensor 102A (e.g., a complementary metal-oxide semiconductor, charge-couple device or other pixel, e.g., modulation pixel, array). The sensor 102A is electrically coupled to a substrate 105A (e.g., a PCB) via electrical contacts 106A (such as wires, vias, solder bumps/bump-bonding). In some instances, e.g., when the sensor 102A is thin, a cover 107A can be located adjacent to the sensor 102A (i.e., for structural support and/or protection from dust and/or other particles that can arise, for example, during the manufacture and assembly of the optoelectronic module 100A). The cover 107A has a cover thickness 120A. Further, the cover 107A can be a thin layer of glass, for example, or other highly transmissive optical polymer. In other instances, the transparent cover 107A can be implemented as a filter (e.g., an infrared pass filter, IR cut filter, or a filter that can be configured to pass or block any other wavelength or range of wavelengths). Still in other instances the transparent cover 107A can also be coated or partly coated (e.g., with a filter material such as a polymer and/or dielectric material). In such instances, the coated transparent cover 107A can pass and/or block any wavelength or range of wavelengths (such as infrared, ultraviolet, or wavelengths corresponding to red, green, blue or other visible colors). Still further, in such instances the transparent cover 107A can be partly coated with a plurality and/or array of coatings and/or a filter array (such as a color filter array). The optoelectronic module 100A further includes an optical assembly 110A. The optical assembly 110A includes a plurality of optical elements 111A mounted and/or integrated into an optical housing 112A. The optical elements 111A and their respective position can delineate a focal length 113A of the optical assembly 110A and an optical axis 114A (depicted in FIG. 2A as substantially orthogonal to the sensor 102A). However, the optoelectronic module 100A can have a variation in the cover thickness 120A of the transparent cover 107A. Accordingly, the focal length 113A is not focused on the sensor 102A.

FIG. 2B depicts an optoelectronic module 100B. The optoelectronic module 100B can include a sensor 102B (e.g., a complementary metal-oxide semiconductor, charge-couple device or other pixel, e.g., modulation pixel, array). The sensor 102B is electrically coupled to a substrate 105B (e.g., a PCB) via electrical contacts 106B (such as wires, vias, solder bumps/bump-bonding). In some instances, e.g., when the sensor 102B is thin, a cover 107B can be located adjacent to the sensor 102B (i.e., for structural support and/or protection from dust and/or other particles that can arise, for example, during the manufacture and assembly of the optoelectronic module 100B). The cover 107B has a cover thickness 120B. Further, the cover 107B can be a thin layer of glass, for example, or other highly transmissive optical polymer. In other instances, the transparent cover 107B can be implemented as a filter (e.g., an infrared pass filter, IR cut filter, or a filter that can be configured to pass or block any other wavelength or range of wavelengths). Still in other instances the transparent cover 107B can also be coated or partly coated (e.g., with a filter material such as a polymer and/or dielectric material). In such instances, the coated transparent cover 107B can pass and/or block any wavelength or range of wavelengths (such as infrared, ultraviolet, or wavelengths corresponding to red, green, blue or other visible colors). Still further, in such instances the transparent cover 107B can be partly coated with a plurality and/or array of coatings and/or a filter array (such as a color filter array). The optoelectronic module 100B further includes an optical assembly 110B. The optical assembly 110B includes a plurality of optical elements 111B mounted and/or integrated into an optical housing 112B. The optical elements 111B and their respective position can delineate a focal length 113B of the optical assembly 110B and an optical axis 114B. However, the optical axis 114B depicted in FIG. 2B is at a tilt t with respect to a desired optical axis 114B".

FIG. 3A depicts an example customizable optoelectronic module 300A. The customizable optoelectronic module 300A includes a customizable spacer assembly 301A configured to mitigate a thickness variation in a cover 307A (e.g., the thickness variation depicted in the cover 107A in FIG. 2A). The customizable spacer assembly 301A includes a sensor 302A (such as an array of photodiodes, intensity pixels, demodulation pixels, or a combination of any of the aforementioned). Further the sensor 302A can be configured to detect any wavelength or range of wavelengths of electromagnetic radiation (e.g., visible or non-visible radiation such as near-, mid-, or far-infrared radiation). The sensor 302A is electrically coupled to a substrate 305A (such as PCB glass-fiber laminate, and/or silicon) via electrical contacts 306A (such as wires, vias, solder bumps/bump-bonding). The customizable spacer assembly 301A further includes a cover 307A adjacent to the sensor 302A, and a customizable spacer 308A. The cover has a first thickness 320A and a peripheral surface 319A (e.g., the circumferential surface of the cover 307A). The peripheral spacer surface 319A of the cover 307A can be laterally surrounded by the spacer 308A. The spacer 308A can be substantially non-transparent to wavelengths of light detectable by the sensor 302A. Further the spacer 308A can be configured to mitigate, insulate against electrostatic discharge (EDS). The spacer 308A can be manufactured from a curable polymeric material (such as epoxy) via injection molding, vacuum injection molding or other replication process, and can further contain substantially non-transparent filler and/or low-thermal-expansion filler (such as carbon black and/or inorganic filler). The customizable spacer 308A includes a spacer extension 321A extending from the customizable spacer 308A with a second thickness 322A. The spacer extension 321A terminates with a customizable spacer surface 309A of a second thickness 322A. The customizable spacer surface 309A can be customizable or modifiable (e.g., machined) such that the first thickness 320A and the second thickness 322A sum to a first standard value 323. The standard value 323, for example, should be the same for a plurality of customizable optoelectronic modules 300A in order to avoid binning.

For example, FIG. 3B depicts another customizable optoelectronic module 300B. The customizable optoelectronic module 300B includes components as described above in FIG. 3A. The customizable optoelectronic module 300B includes a first thickness 320B and a second thickness 322B (akin to the customizable optoelectronic module 300A depicted in FIG. 3A). However, the first thickness 320A of the customizable optoelectronic module 300A depicted in FIG. 3A and the first thickness 320B of the customizable optoelectronic module 300B depicted in FIG. 3B may not be equal. Further, the second thickness 322A of the customizable optoelectronic module 300A depicted in FIG. 3A, and the second thickness 322B of the customizable optoelectronic module 300B depicted in FIG. 3B are also not equal. However, the first standard value 323 depicted in both FIG. 3A and FIG. 3B may be equal.

An example optoelectronic module can also include an optical assembly as depicted in FIG. 3C. A customizable optoelectronic module 300C includes components as described above in FIG. 3A and FIG. 3B. For example, customizable optoelectronic module 300C includes a customizable spacer assembly 301C configured to mitigate a thickness variation in a cover 307C (e.g., the thickness variation depicted in the cover 107A in FIG. 2A). The customizable spacer assembly 301C includes a sensor 302C (such as an array of photodiodes, intensity pixels, demodulation pixels, or a combination of any of the aforementioned). Further the sensor 302C can be configured to detect any wavelength or range of wavelengths of electromagnetic radiation (e.g., visible or non-visible radiation such as near-, mid-, or far-infrared radiation). The sensor 302C is electrically coupled to a substrate 305C (such as PCB glass-fiber laminate, and/or silicon) via electrical contacts 306C (such as wires, vias, solder bumps/bump-bonding). The customizable spacer assembly 301C further includes a cover 307C adjacent to the sensor 302C, and a customizable spacer 308C. The cover has a first thickness 320C and a peripheral surface 319C (e.g., the circumferential surface of the cover 307C). The peripheral spacer surface 319C of the cover 307C can be laterally surrounded by the spacer 308C. The spacer 308C can be substantially non-transparent to wavelengths of light detectable by the sensor 302C. Further the spacer 308C can be configured to mitigate, insulate against electrostatic discharge (EDS). The spacer 308C can be manufactured from a curable polymeric material (such as epoxy) via injection molding, vacuum injection molding or other replication process, and can further contain substantially non-transparent filler and/or low-thermal-expansion filler (such as carbon black and/or inorganic filler). The customizable spacer 308C includes a spacer extension 321C extending from the customizable spacer 308C with a second thickness 322C. The spacer extension 321C terminates with a customizable spacer surface 309C of a second thickness 322C. The customizable spacer surface 309C can be customizable or modifiable (e.g., machined) such that the first thickness 320C and the second thickness 322C sum to a first standard value 323C. The standard value 323C, for example, should be the same for a plurality of customizable optoelectronic modules 300C in order to avoid binning. However, variations in the first standard value 323C among a plurality of customizable optoelectronic module 300C is possible to correct for other dimensional variations, such as a plurality of respective optical assemblies with variable focal lengths, as discussed below.

The customizable optoelectronic module 300C also includes an optical assembly 310C. The optical assembly 310C includes a plurality of optical elements 311C mounted and/or integrated within an optical housing 312C. The optical housing 312C can be manufactured from a curable polymeric material (such as epoxy) via injection molding, vacuum injection molding or other replication process, and can further contain substantially non-transparent filler and/or low-thermal-expansion filler (such as carbon black and/or inorganic filler). The optical assembly 310C can include any one of, or combinations of, the following optical elements: a diffraction grating, a microlens array, a lens, an anamorphic lens, a prism, a micro-prism array, a diffractive optical element, or a plurality of any one of the aforementioned or their respective combinations. Further, in other instances the optical assembly 310C can be configured for optical autofocus. For example, the optical assembly 310C can include actuating components (e.g., piezoelectric and/or voice-coil actuating elements) to actuate any or all of the optical elements 311C. Further any or all of the optical elements 311C can be implemented as tunable lenses (i.e., tunable via an external stimulus such as an electric field). The optical elements 311C can be manufactured from a glass or glass-like material via molding, grinding, or polishing. In other implementations the optical elements 311C can be manufactured from a curable polymeric material (such as epoxy) via injection molding, vacuum injection molding, or other replication process. Still in other implementations the optical elements 311C can each be manufactured from a glass or glass-like material, or from a curable polymeric material, or their respective combinations. The optical assembly 310C can further include apertures, filters, spacers, alignment features, and other components pertinent to their respective functions. The optical elements 311C can delineate a focal length 313C of the optical assembly 310C, and an optical axis 314C. The customizable spacer assembly 301C depicted in FIG. 3C can be configured such that it can mitigate thickness variations in the cover 307C (i.e., a first thickness 320C) as described above, thereby ensuring that the focal length 313C is focused on the sensor 302C. For example, the customizable spacer surface 309C can be customized or modified (e.g., machined) by a thickness substantially equivalent to a variation in transparent cover 307C thickness, such that the optical assembly 310C is focused on the sensor 302C.

Another example of an optoelectronic module with an optical assembly is depicted in FIG. 3D. A customizable optoelectronic module 300D includes components as described above in FIG. 3A-FIG. 3C. For example, customizable optoelectronic module 300D includes a customizable spacer assembly 301D configured to mitigate a thickness variation in a cover 307D (e.g., the thickness variation depicted in the cover 107A in FIG. 2A). The customizable spacer assembly 301D includes a sensor 302D (such as an array of photodiodes, intensity pixels, demodulation pixels, or a combination of any of the aforementioned). Further the sensor 302D can be configured to detect any wavelength or range of wavelengths of electromagnetic radiation (e.g., visible or non-visible radiation such as near-, mid-, or far-infrared radiation). The sensor 302D is electrically coupled to a substrate 305D (such as PCB glass-fiber laminate, and/or silicon) via electrical contacts 306D (such as wires, vias, solder bumps/bump-bonding). The customizable spacer assembly 301D further includes a cover 307D adjacent to the sensor 302D, and a customizable spacer 308D. The cover has a first thickness 320D and a peripheral surface 319D (e.g., the circumferential surface of the cover 307D). The peripheral spacer surface 319D of the cover 307D can be laterally surrounded by the spacer 308D. The spacer 308D can be substantially non-transparent to wavelengths of light detectable by the sensor 302D. Further the spacer 308D can be configured to mitigate, insulate against electrostatic discharge (EDS). The spacer 308D can be manufactured from a curable polymeric material (such as epoxy) via injection molding, vacuum injection molding or other replication process, and can further contain substantially non-transparent filler and/or low-thermal-expansion filler (such as carbon black and/or inorganic filler). The customizable spacer 308D includes a spacer extension 321D extending from the customizable spacer 308D with a second thickness 322D. The spacer extension 321D terminates with a customizable spacer surface 309D of a second thickness 322D. The customizable spacer surface 309D can be customizable or modifiable (e.g., machined) such that in some cases, the first thickness 320D and the second thickness 322D sum to a first standard value 323D. The first standard value 323D, for example, should be the same for a plurality of customizable optoelectronic modules 300D in order to avoid binning. However, variations in the first standard value 323D among a plurality of customizable optoelectronic module 300D is possible to correct for other dimensional variations, such as tilted optical assemblies, as discussed below.

The customizable optoelectronic module 300D also includes such an optical assembly 310D. The optical assembly 310D includes a plurality of optical elements 311D mounted and/or integrated within an optical housing 312D. The optical housing 312D can be manufactured from a curable polymeric material (such as epoxy) via injection molding, vacuum injection molding or other replication process, and can further contain substantially non-transparent filler and/or low-thermal-expansion filler (such as carbon black and/or inorganic filler). The optical assembly 310D can include any one of, or combinations of, the following optical elements: a diffraction grating, a microlens array, a lens, an anamorphic lens, a prism, a micro-prism array, a diffractive optical element, or a plurality of any one of the aforementioned or their respective combinations. Further, in other instances the optical assembly 310D can be configured for optical autofocus. For example, the optical assembly 310D can include actuating components (e.g., piezoelectric and/or voice-coil actuating elements) to actuate any or all of the optical elements 311D. Further any or all of the optical elements 311D can be implemented as tunable lenses (i.e., tunable via an external stimulus such as an electric field). The optical elements 311D can be manufactured from a glass or glass-like material via molding, grinding, or polishing. In other implementations the optical elements 311D can be manufactured from a curable polymeric material (such as epoxy) via injection molding, vacuum injection molding, or other replication process. Still in other implementations the optical elements 311D can each be manufactured from a glass or glass-like material, or from a curable polymeric material, or their respective combinations. The optical assembly 310D can further include apertures, filters, spacers, alignment features, and other components pertinent to their respective functions. The optical elements 311D can delineate a focal length 313D of the optical assembly 310D, and an optical axis 314D. However in some cases, as depicted in FIG. 3D, the optical axis can be canted with a tilt t. The customizable spacer assembly 301D depicted in FIG. 3D can be configured such that it can mitigate thickness variations in the cover 307D (i.e., a first thickness 320D) as well as the tilt t, thereby ensuring that the focal length 313D is focused on the sensor 302D and that the optical axis 314D is substantially orthogonal to the sensor 302D. For example, the customizable spacer surface 309D can be customized or modified (e.g., machined) by a thickness, even by a varying thickness when correcting for tilt t.

Another example of an optoelectronic module with an optical assembly is depicted in FIG. 3E. A customizable optoelectronic module 300E includes components as described above in FIG. 3A-FIG. 3D. For example, customizable optoelectronic module 300E includes a customizable spacer assembly 301E configured to mitigate a thickness variation in a cover 307E (e.g., the thickness variation depicted in the cover 107A in FIG. 2A). The customizable spacer assembly 301E includes a sensor 302E (such as an array of photodiodes, intensity pixels, demodulation pixels, or a combination of any of the aforementioned). Further the sensor 302E can be configured to detect any wavelength or range of wavelengths of electromagnetic radiation (e.g., visible or non-visible radiation such as near-, mid-, or far-infrared radiation). The sensor 302E is electrically coupled to a substrate 305E (such as PCB glass-fiber laminate, and/or silicon) via electrical contacts 306E (such as wires, vias, solder bumps/bump-bonding). The customizable spacer assembly 301E further includes a cover 307E adjacent to the sensor 302E, and a customizable spacer 308E. The cover has a first thickness 320E and a peripheral surface 319E (e.g., the circumferential surface of the cover 307E). The peripheral spacer surface 319E of the cover 307E can be laterally surrounded by the spacer 308E. The spacer 308E can be substantially non-transparent to wavelengths of light detectable by the sensor 302E. Further the spacer 308E can be configured to mitigate, insulate against electrostatic discharge (EDS). The spacer 308E can be manufactured from a curable polymeric material (such as epoxy) via injection molding, vacuum injection molding or other replication process, and can further contain substantially non-transparent filler and/or low-thermal-expansion filler (such as carbon black and/or inorganic filler). The customizable spacer 308E includes a spacer extension 321E extending from the customizable spacer 308C with a second thickness 322E. The spacer extension 321E terminates with a customizable spacer surface 309E of a second thickness 322E. The customizable spacer surface 309E can be customizable or modifiable (e.g., machined) such that the first thickness 320E and the second thickness 322E sum to a first standard value 323E. The standard value 323E, for example, should be the same for a plurality of customizable optoelectronic modules 300E in order to avoid binning. However, variations in the first standard value 323E among a plurality of customizable optoelectronic module 300E is possible in order to correct for other dimensional variations, such as a plurality of respective optical assemblies with variable focal lengths, as discussed below.

The customizable optoelectronic module 300E also includes an optical assembly 310E. The optical assembly 310E includes a plurality of optical elements 311E mounted and/or integrated within an optical housing 312E. The optical housing 312E can be manufactured from a curable polymeric material (such as epoxy) via injection molding, vacuum injection molding or other replication process, and can further contain substantially non-transparent filler and/or low-thermal-expansion filler (such as carbon black and/or inorganic filler). The optical assembly 310E can include any one of, or combinations of, the following optical elements: a diffraction grating, a microlens array, a lens, an anamorphic lens, a prism, a micro-prism array, a diffractive optical element, or a plurality of any one of the aforementioned or their respective combinations. Further, in other instances the optical assembly 310E can be configured for optical autofocus. For example, the optical assembly 310E can include actuating components (e.g., piezoelectric and/or voice-coil actuating elements) to actuate any or all of the optical elements 311E. Further any or all of the optical elements 311E can be implemented as tunable lenses (i.e., tunable via an external stimulus such as an electric field). The optical elements 311E can be manufactured from a glass or glass-like material via molding, grinding, or polishing. In other implementations the optical elements 311E can be manufactured from a curable polymeric material (such as epoxy) via injection molding, vacuum injection molding, or other replication process. Still in other implementations the optical elements 311E can each be manufactured from a glass or glass-like material, or from a curable polymeric material, or their respective combinations. The optical assembly 310E can further include apertures, filters, spacers, alignment features, and other components pertinent to their respective functions. The optical elements 311E can delineate a focal length 313E of the optical assembly 310E, and an optical axis 314E. The customizable spacer assembly 301E depicted in FIG. 3E can be configured such that it can mitigate thickness variations in the cover 307E (i.e., a first thickness 320E) as described above as well as variations in the optical housing 312E (e.g., variations due to the positioning of the optical elements 311E within the optical housing 312E), thereby ensuring that the focal length 313E is focused on the sensor 302E. For example, the customizable spacer surface 309E can be customized or modified (e.g., machined) by a thickness substantially equivalent to a variation in the thickness (first thickness 320E) of the cover 307E or a variation in the position of the optical elements 311E within the optical housing 312E, such that the optical assembly 310E is focused on the sensor 302E.

The optical housing 312E depicted in FIG. 3E further includes a customizable optical housing extension 315E extending from the optical housing 312E with a third thickness 317E. The customizable optical housing extension 315E terminates with a customizable optical housing extension surface 316E. The customizable optical housing extension surface 316E is customizable or modifiable akin to the spacer extension 321E. That is, the customizable optical housing extension surface 316E can be configured such that it can mitigate thickness variations in the cover 307E (i.e., a first thickness 320E) as described above as well as variations in the optical housing 312E (e.g., variations due to the positioning of the optical elements 311E within the optical housing 312E), thereby ensuring that the focal length 313E is focused on the sensor 302E. For example, the customizable optical housing extension surface 316E can be customized or modified (e.g., machined) by a thickness substantially equivalent to a variation in the thickness (first thickness 320E) of the cover 307E or a variation in the position of the optical elements 311E within the optical housing 312E, such that the optical assembly 310E is focused on the sensor 302E.

Another example of an optoelectronic module with an optical assembly is depicted in FIG. 3F. A customizable optoelectronic module 300F includes components as described above in FIG. 3A-FIG. 3E. For example, customizable optoelectronic module 300F includes a customizable spacer assembly 301F configured to mitigate a thickness variation in a cover 307F (e.g., the thickness variation depicted in the cover 107A in FIG. 2A). The customizable spacer assembly 301F includes a sensor 302F (such as an array of photodiodes, intensity pixels, demodulation pixels, or a combination of any of the aforementioned). Further the sensor 302F can be configured to detect any wavelength or range of wavelengths of electromagnetic radiation (e.g., visible or non-visible radiation such as near-, mid-, or far-infrared radiation). The sensor 302F is electrically coupled to a substrate 305F (such as PCB glass-fiber laminate, and/or silicon) via electrical contacts 306F (such as wires, vias, solder bumps/bump-bonding). The customizable spacer assembly 301F further includes a cover 307F adjacent to the sensor 302F, and a customizable spacer 308F. The cover has a first thickness 320F and a peripheral surface 319F (e.g., the circumferential surface of the cover 307F). The peripheral spacer surface 319F of the cover 307F can be laterally surrounded by the spacer 308F. The spacer 308F can be substantially non-transparent to wavelengths of light detectable by the sensor 302F. Further the spacer 308F can be configured to mitigate, insulate against electrostatic discharge (EDS). The spacer 308F can be manufactured from a curable polymeric material (such as epoxy) via injection molding, vacuum injection molding or other replication process, and can further contain substantially non-transparent filler and/or low-thermal-expansion filler (such as carbon black and/or inorganic filler). The customizable spacer 308F includes a spacer extension 321F extending from the customizable spacer 308F with a second thickness 322F. The spacer extension 321F terminates with a customizable spacer surface 309F of a second thickness 322F. The customizable spacer surface 309F can be customizable or modifiable (e.g., machined) such that the first thickness 320F and the second thickness 322F sum to a first standard value 323F. The standard value 323F, for example, should be the same for a plurality of customizable optoelectronic modules 300F in order to avoid binning. However, variations in the first standard value 323F among a plurality of customizable optoelectronic module 300F is possible in order to correct for other dimensional variations, such as a plurality of respective optical assemblies with variable focal lengths, as discussed below.

The customizable optoelectronic module 300F also includes an optical assembly 310F. The optical assembly 310F includes a plurality of optical elements 311F mounted and/or integrated within an optical housing 312F. The optical housing 312F can be manufactured from a curable polymeric material (such as epoxy) via injection molding, vacuum injection molding or other replication process, and can further contain substantially non-transparent filler and/or low-thermal-expansion filler (such as carbon black and/or inorganic filler). The optical assembly 310F can include any one of, or combinations of, the following optical elements: a diffraction grating, a microlens array, a lens, an anamorphic lens, a prism, a micro-prism array, a diffractive optical element, or a plurality of any one of the aforementioned or their respective combinations. Further, in other instances the optical assembly 310F can be configured for optical autofocus. For example, the optical assembly 310F can include actuating components (e.g., piezoelectric and/or voice-coil actuating elements) to actuate any or all of the optical elements 311F. Further any or all of the optical elements 311F can be implemented as tunable lenses (i.e., tunable via an external stimulus such as an electric field). The optical elements 311F can be manufactured from a glass or glass-like material via molding, grinding, or polishing. In other implementations the optical elements 311F can be manufactured from a curable polymeric material (such as epoxy) via injection molding, vacuum injection molding, or other replication process. Still in other implementations the optical elements 311F can each be manufactured from a glass or glass-like material, or from a curable polymeric material, or their respective combinations. The optical assembly 310F can further include apertures, filters, spacers, alignment features, and other components pertinent to their respective functions. The optical elements 311F can delineate a focal length 313F of the optical assembly 310F, and an optical axis 314F. The customizable spacer assembly 301F depicted in FIG. 3F can be configured such that it can mitigate thickness variations in the cover 307F (i.e., a first thickness 320F) as described above as well as variations in the optical housing 312F (e.g., variations due to the positioning of the optical elements 311F within the optical housing 312F), thereby ensuring that the focal length 313F is focused on the sensor 302F. For example, the customizable spacer surface 309F can be customized or modified (e.g., machined) by a thickness substantially equivalent to a variation in the thickness (first thickness 320F) of the cover 307F or a variation in the position of the optical elements 311F within the optical housing 312F, such that the optical assembly 310E is focused on the sensor 302F.

The optical housing 312F depicted in FIG. 3F further includes a customizable optical housing extension 315F extending from the optical housing 312F with a third thickness 317F. The customizable optical housing extension 315F terminates with a customizable optical housing extension surface 316F. The customizable optical housing extension surface 316F is customizable or modifiable akin to the spacer extension 321F. That is, the customizable optical housing extension surface 316F can be configured such that it can mitigate thickness variations in the cover 307F (i.e., a first thickness 320F) as described above as well as variations in the optical housing 312F (e.g., variations due to the positioning of the optical elements 311F within the optical housing 312F), and further can mitigate tilt (as depicted in FIG. 3F), thereby ensuring that the focal length 313F is focused on the sensor 302F. For example, the customizable optical housing extension surface 316F can be customized or modified (e.g., machined) by a thickness substantially equivalent to a variation in the thickness (first thickness 320F) of the cover 307F, and/or a variation in the position of the optical elements 311F within the optical housing 312F, and/or a tilt, such that the optical assembly 310F is focused on the sensor 302F.

Figures 4A, 4B:
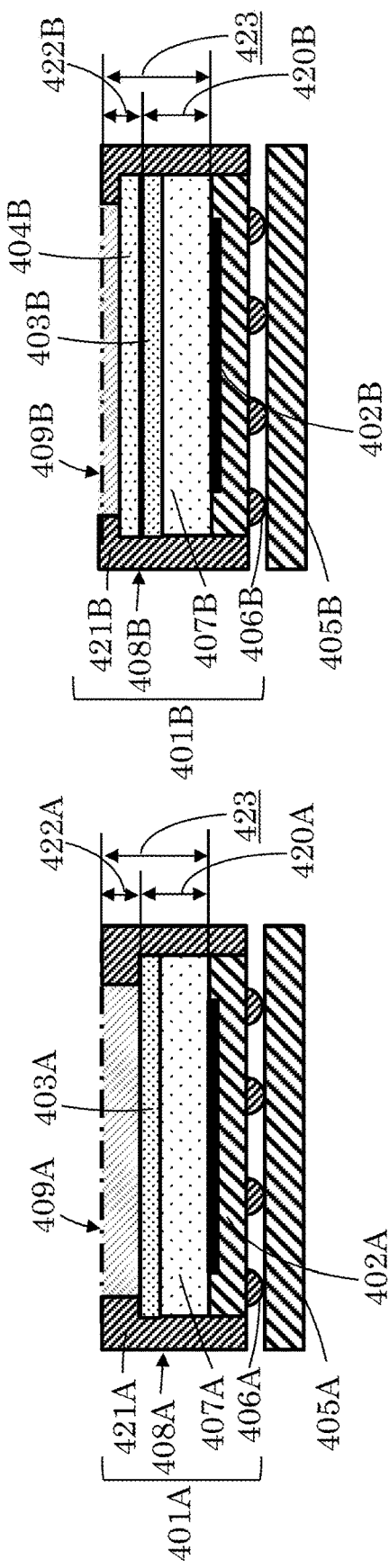
FIG. 4A and FIG. 4B depict example optoelectronic modules with customizable spacers and optical filters.

In some implementations, the covers as described above can include an optical filter as depicted in FIG. 4A. FIG. 4A depicts an example customizable optoelectronic module 400A. The customizable optoelectronic module 400A includes a customizable spacer assembly 401A configured to mitigate a thickness variation in a cover 407A (e.g., a thickness variation depicted in the cover 107A in FIG. 2A). The customizable spacer assembly 401A includes a sensor 402A (such as an array of photodiodes, intensity pixels, demodulation pixels, or a combination of any of the aforementioned). Further the sensor 402A can be configured to detect any wavelength or range of wavelengths of electromagnetic radiation (e.g., visible or non-visible radiation such as near-, mid-, or far-infrared radiation). The sensor 402A is electrically coupled to a substrate 405A (such as PCB glass-fiber laminate, and/or silicon) via electrical contacts 406A (such as wires, vias, solder bumps/bump-bonding). The customizable spacer assembly 401A further includes a cover 407A adjacent to the sensor 402A, and a customizable spacer 408A. The cover 407A includes a first optical filter 403A. The cover 407A and the first optical filter 403A together have a first thickness 420A and a peripheral surface 419A (e.g., the circumferential surface of the cover 407A and the first optical filter 403A). The peripheral surface 419A of the cover 407A and the first optical filter 403A can be laterally surrounded by the spacer 408A. The spacer 408A can be substantially non-transparent to wavelengths of light detectable by the sensor 402A. Further the spacer 408A can be configured to mitigate, insulate against electrostatic discharge (EDS). The spacer 408A can be manufactured from a curable polymeric material (such as epoxy) via injection molding, vacuum injection molding or other replication process, and can further contain substantially non-transparent filler and/or low-thermal-expansion filler (such as carbon black and/or inorganic filler). The customizable spacer 408A includes a spacer extension 421A extending from the customizable spacer 408A with a second thickness 422A. The spacer extension 421A terminates with a customizable spacer surface 409A of a second thickness 422A. The customizable spacer surface 409A can be customizable or modifiable (e.g., machined) such that the first thickness 420A and the second thickness 422A sum to a first standard value 423 (as described above). The standard value 423, for example, should be the same for a plurality of customizable optoelectronic modules 400A in order to avoid binning.

For example, FIG. 4B depicts another customizable optoelectronic module 400B with an additional optical filter. The customizable optoelectronic module 400B includes components as described above in FIG. 4A. The customizable optical assembly 400B includes a second optical filter 404B. Together the cover 407B, the first optical filter 403B, and the second optical filter 404B have a first thickness 420B and a peripheral surface 419B (e.g., the circumferential surface of the cover 407B, the first optical filter 403B, and the second optical filter 404B). The customizable optoelectronic module 400B includes a first thickness 420B and a second thickness 422B (akin to the customizable optoelectronic module 400A depicted in FIG. 4A). However, the first thickness 420A of the customizable optoelectronic module 400A depicted in FIG. 4A and the first thickness 420B of the customizable optoelectronic module 400B depicted in FIG. 4B may not be equal. Further, the second thickness 422A of the customizable optoelectronic module 400A depicted in FIG. 4A, and the second thickness 422B of the customizable optoelectronic module 400B depicted in FIG. 4B are also not equal.

Figure 5:
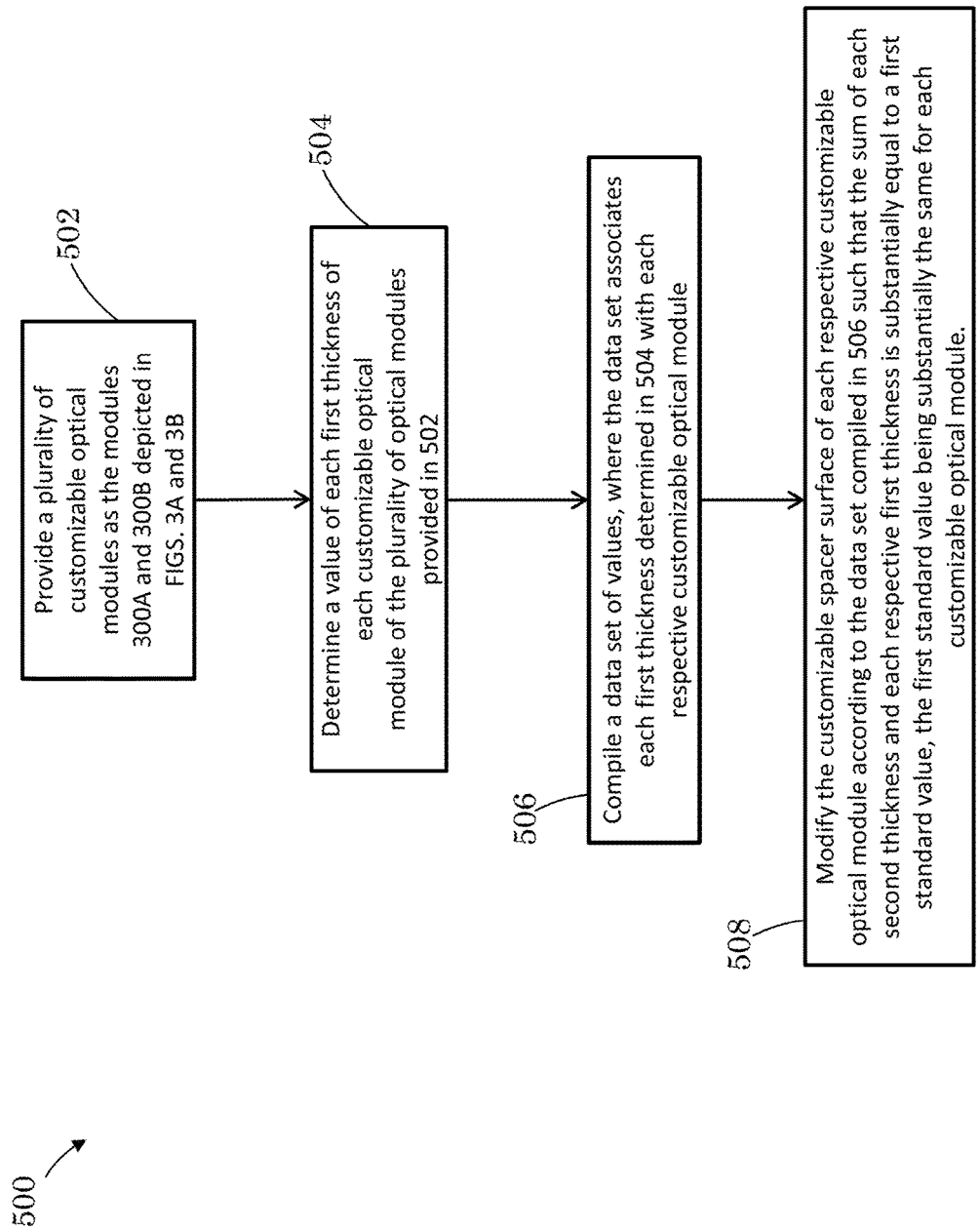
FIGS. 5-11 depict example methods for standardizing the customizable optoelectronic modules depicted in FIGS. 3-4.

FIG. 5 depicts an example method 500 of standardizing a plurality of customizable optoelectronic modules such as the customizable optoelectronic modules 300A, 300B as depicted above in FIG. 3A and FIG. 3B, respectively. The method of standardizing a plurality of customizable optoelectronic modules 500 includes a providing step 502, a determining step 504, a compiling step 506, and a modifying step 508.

The providing step 502 includes providing a plurality of customizable optoelectronic modules for example as depicted in the figures above. Each customizable optoelectronic module within the plurality of customizable optoelectronic modules includes a substrate on which is electrically mounted a sensor, a cover having a first thickness disposed over the sensor, a customizable spacer assembly having a customizable spacer laterally surrounding a peripheral surface of the cover, and a spacer extension extending from the customizable spacer with a second thickness having a terminal end defining a customizable spacer surface. Further the determining step 504 includes determining a value of each first thickness of each customizable optoelectronic module within the plurality of optoelectronic modules. The first thickness can be determined optically, for example. Further, the compiling step 506 includes compiling a data set of values, wherein the data set associates each first thickness with each respective customizable optoelectronic module. The modifying step 508 includes modifying the customizable spacer surface of each respective customizable optoelectronic module according to the data set such that the sum of each second thickness and each respective first thickness is substantially equal to a first standard value, the first standard value being substantially the same for each customizable optoelectronic module within the plurality of optoelectronic modules. The customizable spacer surface can be machined, for example, by an automated dicing, cutting, or grinding machine. Further the data set may be compiled by such an automated machine in some cases.

Figure 6:
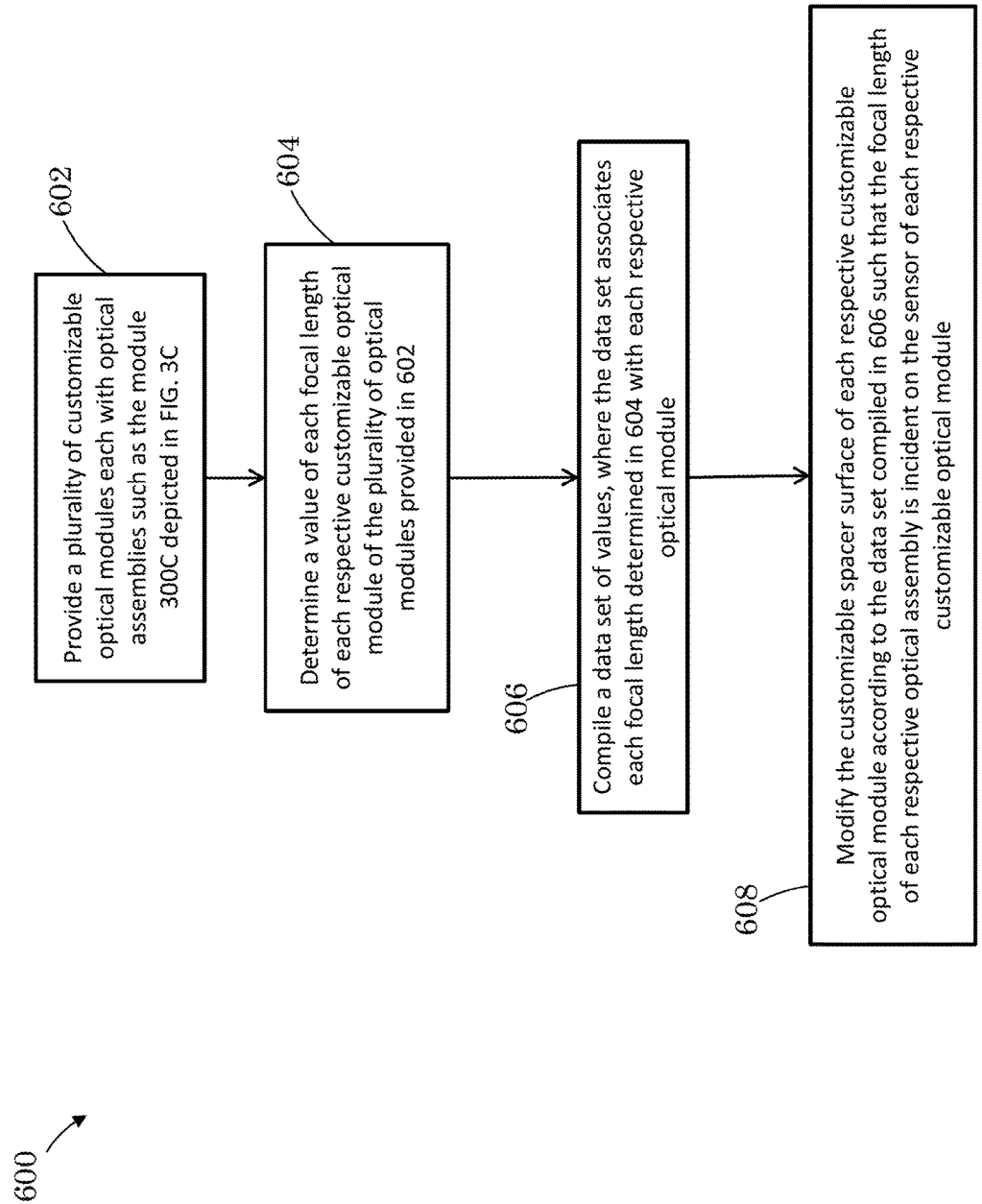

FIG. 6 depicts an example method 600 of standardizing a plurality of customizable optoelectronic modules such as the customizable optoelectronic modules 300C as depicted above in FIG. 3C. The method of standardizing a plurality of customizable optoelectronic modules 600 includes a providing step 602, a determining step 604, a compiling step 606, and a modifying step 608.

The providing step 602 includes providing a plurality of customizable optoelectronic modules for example as depicted in the figures above. Each customizable optoelectronic module within the plurality of optoelectronic modules includes a substrate on which is electrically mounted a sensor, a cover having a first thickness disposed over the sensor, a customizable spacer assembly having a customizable spacer laterally surrounding a peripheral surface of the cover, a spacer extension extending from the customizable spacer with a second thickness having a terminal end defining a customizable spacer surface, and an optical assembly including a plurality of optical elements mounted within an optical housing, wherein the optical assembly has a focal length and an optical axis. Further, the determining step 604 includes determining a value of each focal length of each respective optical assembly. The focal length can be determined optically (e.g., via optical inspection methods). Further, the compiling step 606 includes compiling a data set of values, wherein the data set associates each focal length with each respective optoelectronic module. Finally, the modifying step 608 includes modifying the customizable spacer surface of each customizable optoelectronic module according to the data set such that the focal length of each respective optical assembly is incident on the sensor of each respective customizable optoelectronic module. The customizable spacer surface can be machined, for example, by an automated dicing, cutting, or grinding machine. Further the data set may be compiled by such an automated machine in some cases.

Figure 7:
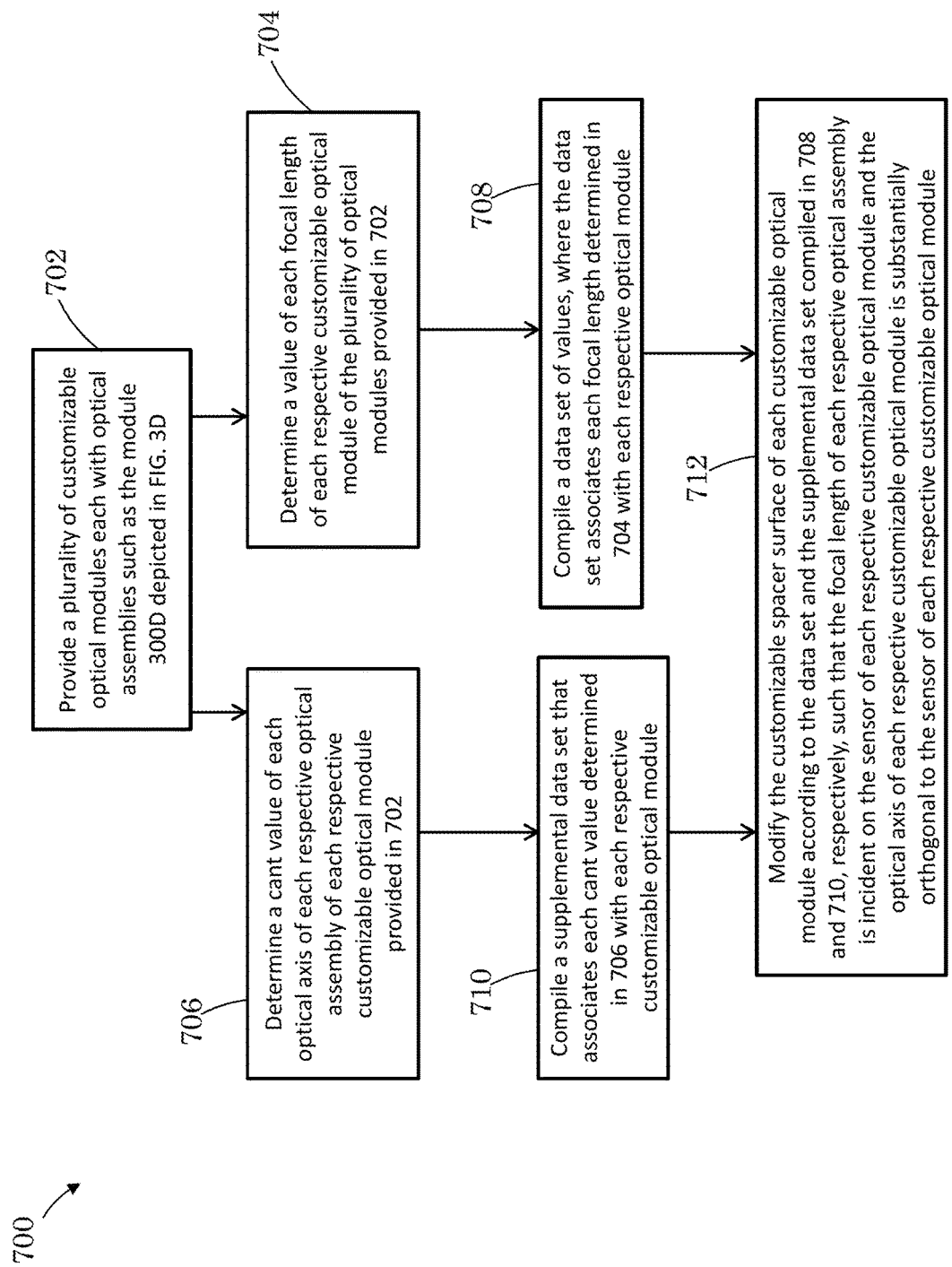

FIG. 7 depicts an example method 700 of standardizing a plurality of customizable optoelectronic modules such as the customizable optoelectronic modules 300D as depicted above in FIG. 3D. The method of standardizing a plurality of customizable optoelectronic modules 700 includes a providing step 702, a first determining step 704, a second determining step 706, a first compiling step 708, a second compiling step 710, and a modifying step 712.

The providing step 702 includes providing a plurality of customizable optoelectronic modules for example as depicted in the figures above. Each customizable optoelectronic module within the plurality of optoelectronic modules includes a substrate on which is electrically mounted a sensor, a cover having a first thickness disposed over the sensor, a customizable spacer assembly having a customizable spacer laterally surrounding a peripheral surface of the cover, a spacer extension extending from the customizable spacer with a second thickness having a terminal end defining a customizable spacer surface, and an optical assembly including a plurality of optical elements mounted within an optical housing, wherein the optical assembly has a focal length and an optical axis. The first determining step 704 includes determining a value of each focal length of each respective optical assembly. The focal length can be determined optically (e.g., via optical inspection methods). The second determining step 706 includes determining a cant value for each optical axis of each respective optical assembly. The cant of each optical axis can be determined optically (e.g., via optical inspection methods). The first compiling step 708 includes compiling a data set of values, wherein the data set associates each focal length with each respective optoelectronic module. The second compiling step 710 includes compiling a supplemental data set that associates each cant value with each respective customizable optoelectronic module. Finally, the modifying step 712 includes modifying the customizable spacer surface of each customizable optoelectronic module according to the data set and the supplemental data set such that the focal length of each respective optical assembly is incident on the sensor of each respective customizable optoelectronic module and the optical axis of each respective customizable optoelectronic module is substantially orthogonal to the sensor of each respective customizable optoelectronic module. The customizable spacer surface can be machined, for example, by an automated dicing, cutting, or grinding machine. Further the data set may be compiled by such an automated machine in some cases.

Figure 8:
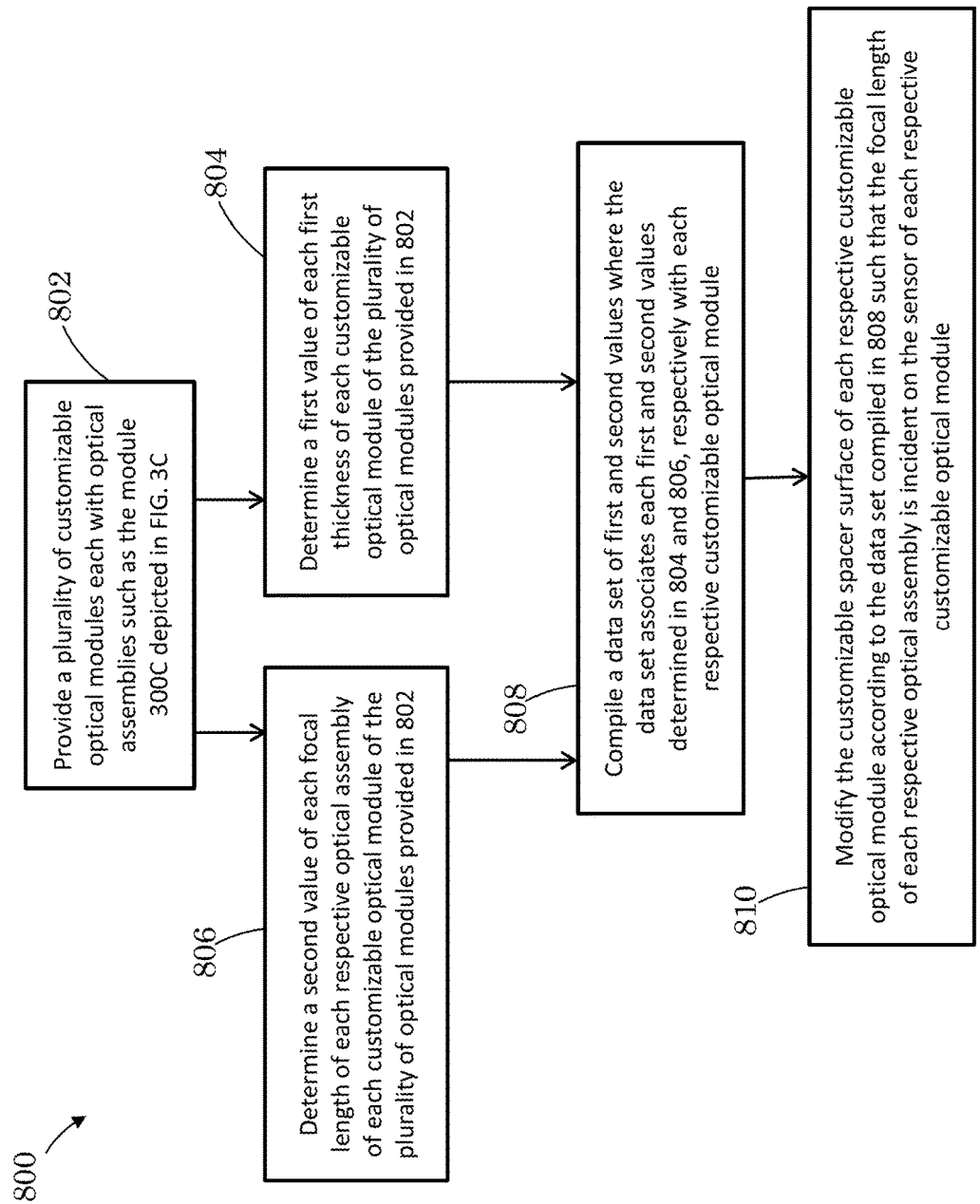

FIG. 8 depicts another example method 800 of standardizing a plurality of customizable optoelectronic modules such as the customizable optoelectronic modules 300C as depicted in FIG. 3C. The method of standardizing a plurality of customizable optoelectronic modules 800 includes a providing step 802, a first determining step 804, a second determining step 806, a compiling step 808, and a modifying step 810.

The providing step 802 includes providing a plurality of customizable optoelectronic modules for example as depicted in the figures above. Each customizable optoelectronic module within the plurality of customizable optoelectronic modules includes a substrate on which is electrically mounted a sensor, a cover having a first thickness disposed over the sensor, a customizable spacer assembly having a customizable spacer laterally surrounding a peripheral surface of the cover, and a spacer extension extending from the customizable spacer with a second thickness having a terminal end defining a customizable spacer surface, and an optical assembly including a plurality of optical elements mounted within an optical housing, wherein the optical assembly has a focal length and an optical axis. The first determining step 804 includes determining a first value of each first thickness of each customizable optoelectronic module comprising the plurality of optoelectronic modules. The first thickness can be determined optically, for example. The second determining step 806 includes determining a second value of each focal length of each respective optical assembly. The focal length can be determined optically (e.g., via optical inspection methods). The compiling step 808 includes compiling a data set of first and second values, wherein the data set associates each first and second value with each respective customizable optoelectronic module. Finally, the modifying step 810 includes modifying the customizable spacer surface of each customizable optoelectronic module according to the data set such that the focal length of each respective optical assembly is incident on the sensor of each respective customizable optoelectronic module. The customizable spacer surface can be machined, for example, by an automated dicing, cutting, or grinding machine. Further the data set may be compiled by such an automated machine in some cases.

Figure 9:
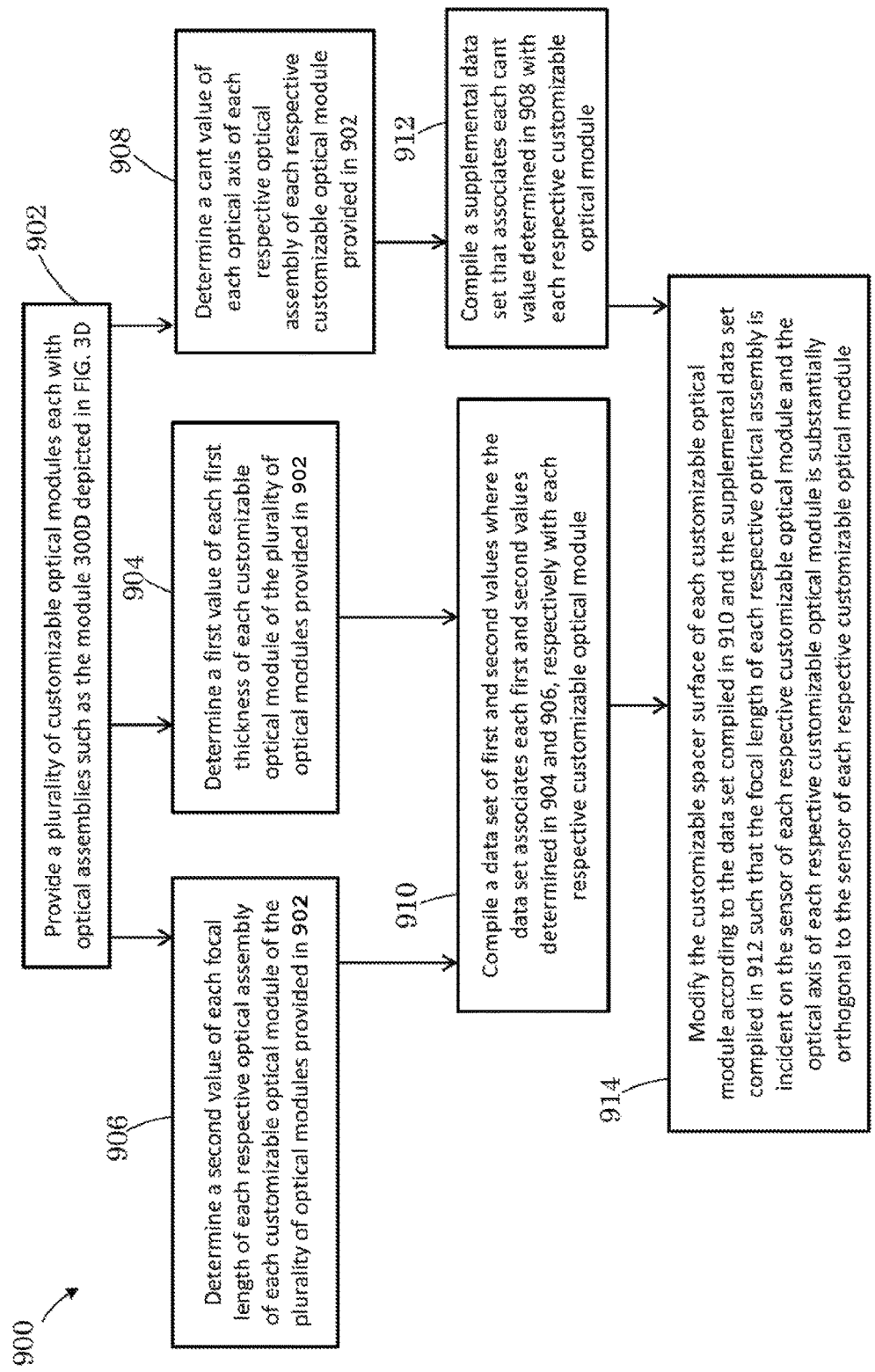

FIG. 9 depicts another example method 900 of standardizing a plurality of customizable optoelectronic modules such as the customizable optoelectronic modules 300D as depicted in FIG. 3D. The method of standardizing a plurality of customizable optoelectronic modules 900 includes a providing step 902, a first determining step 904, a second determining step 906, a third determining step 908, a first compiling step 910, a second compiling step 912, and modifying step 914.

The providing step 902 includes providing a plurality of customizable optoelectronic modules for example as depicted in the figures above. Each customizable optoelectronic module within the plurality of customizable optoelectronic modules includes a substrate on which is electrically mounted a sensor, a cover having a first thickness disposed over the sensor, a customizable spacer assembly having a customizable spacer laterally surrounding a peripheral surface of the cover, and a spacer extension extending from the customizable spacer with a second thickness having a terminal end defining a customizable spacer surface, and an optical assembly including a plurality of optical elements mounted within an optical housing, wherein the optical assembly has a focal length and an optical axis. Further, the first determining step 904 includes determining a first value of each first thickness of each customizable optoelectronic module comprising the plurality of optoelectronic modules. The first thickness can be determined optically, for example. The second determining step 906 includes determining a second value of each focal length of each respective optical assembly. The focal length can be determined optically (e.g., via optical inspection methods). Further, the third determining step 908 includes determining a cant value for each optical axis of each respective optical assembly. The cant of each optical axis can be determined optically (e.g., via optical inspection methods). Further, the first compiling step 910 includes compiling a data set of first and second values, wherein the data set associates each first and second value with each respective customizable optoelectronic module. The second compiling step 912 includes compiling a supplemental data set that associates each cant value with each respective customizable optoelectronic module. Finally, the modifying step 914 includes modifying the customizable spacer surface of each customizable optoelectronic module according to the data set and the supplemental data set such that the focal length of each respective optical assembly is incident on the sensor of each respective customizable optoelectronic module and the optical axis of each respective customizable optoelectronic module is substantially orthogonal to the sensor of each respective customizable optoelectronic module. The customizable spacer surface can be machined, for example, by an automated dicing, cutting, or grinding machine. Further the data set may be compiled by such an automated machine in some cases.

Figure 10:
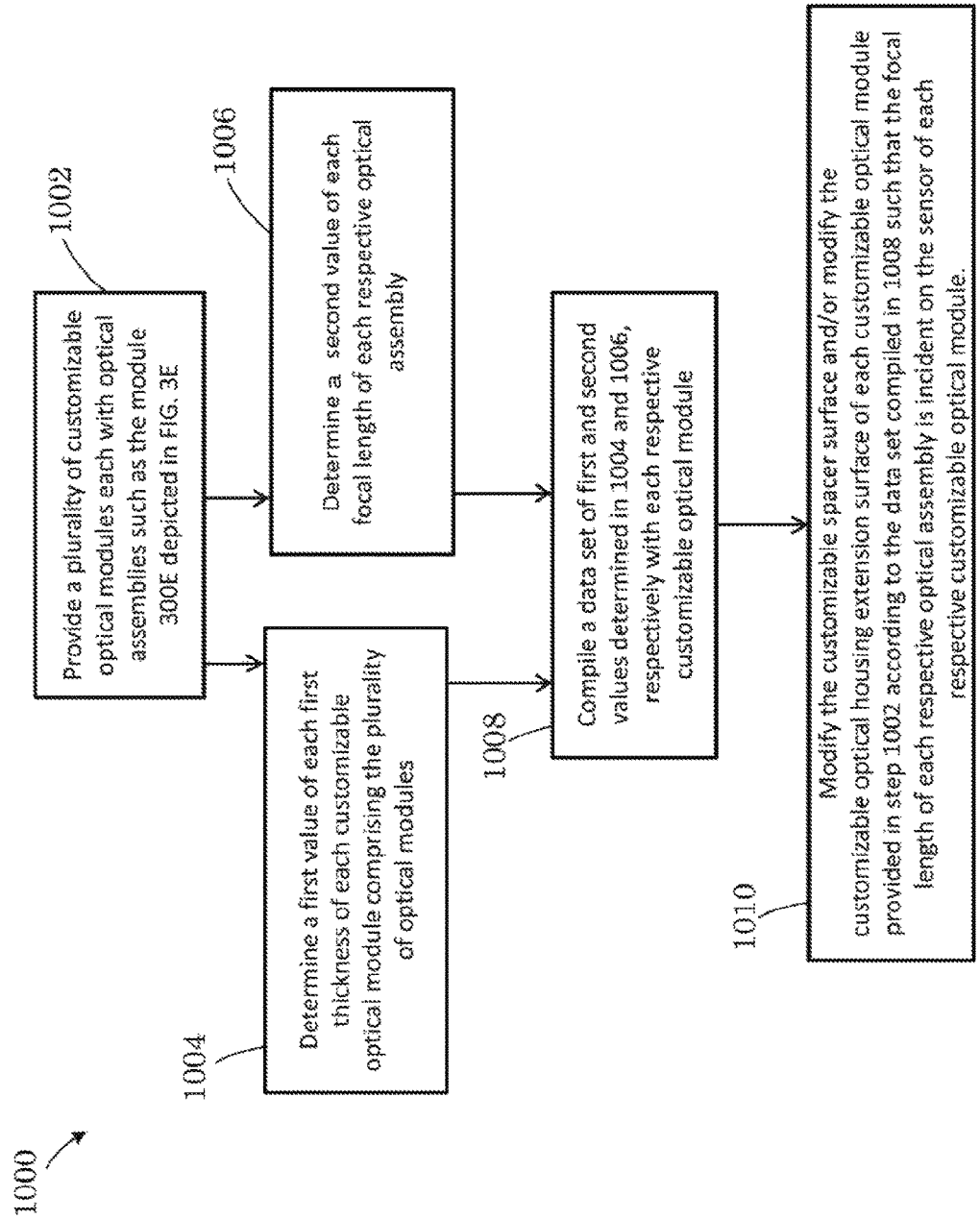

FIG. 10 depicts another example method 1000 of standardizing a plurality of customizable optoelectronic modules such as the customizable optoelectronic modules 300E as depicted in FIG. 3E. The method of standardizing a plurality of customizable optoelectronic modules 1000 includes a providing step 1002, a first determining step 1004, a second determining step 1006, a compiling step 1008, and a modifying step 1010.

The providing step 1002 includes providing a plurality of customizable optoelectronic modules for example as depicted in the figures above. Each customizable optoelectronic module within the plurality of customizable optoelectronic modules includes a substrate on which is electrically mounted a sensor, a cover having a first thickness disposed over the sensor, a customizable spacer assembly having a customizable spacer laterally surrounding a peripheral surface of the cover, and a spacer extension extending from the customizable spacer with a second thickness having a terminal end defining a customizable spacer surface, and an optical assembly including a plurality of optical elements mounted within an optical housing, wherein the optical assembly has a focal length and an optical axis and the optical housing includes a customizable optical housing extension extending from the optical housing with a third thickness having a terminal end defining a customizable optical housing extension surface. Further, the first determining step 1004 includes determining a first value of each first thickness of each customizable optoelectronic module comprising the plurality of optoelectronic modules. The first thickness can be determined optically, for example. The second determining step 1006 includes determining a second value of each focal length of each respective optical assembly. The focal length can be determined optically (e.g., via optical inspection methods). The compiling step 1008 includes compiling a data set of first and second values that associates each first and second values with each respective customizable optoelectronic module. Finally, the modifying step 1010 includes modifying the customizable spacer surface and/or modifying the customizable optical housing extension surface of each customizable optoelectronic module according to the data set such that the focal length of each respective optical assembly is incident on the sensor of each respective customizable optoelectronic module. The customizable spacer surface and/or the customizable optical housing extension surface can be machined, for example, by an automated dicing, cutting, or grinding machine. Further the data set may be compiled by an automated machine in some cases.

Figure 11:
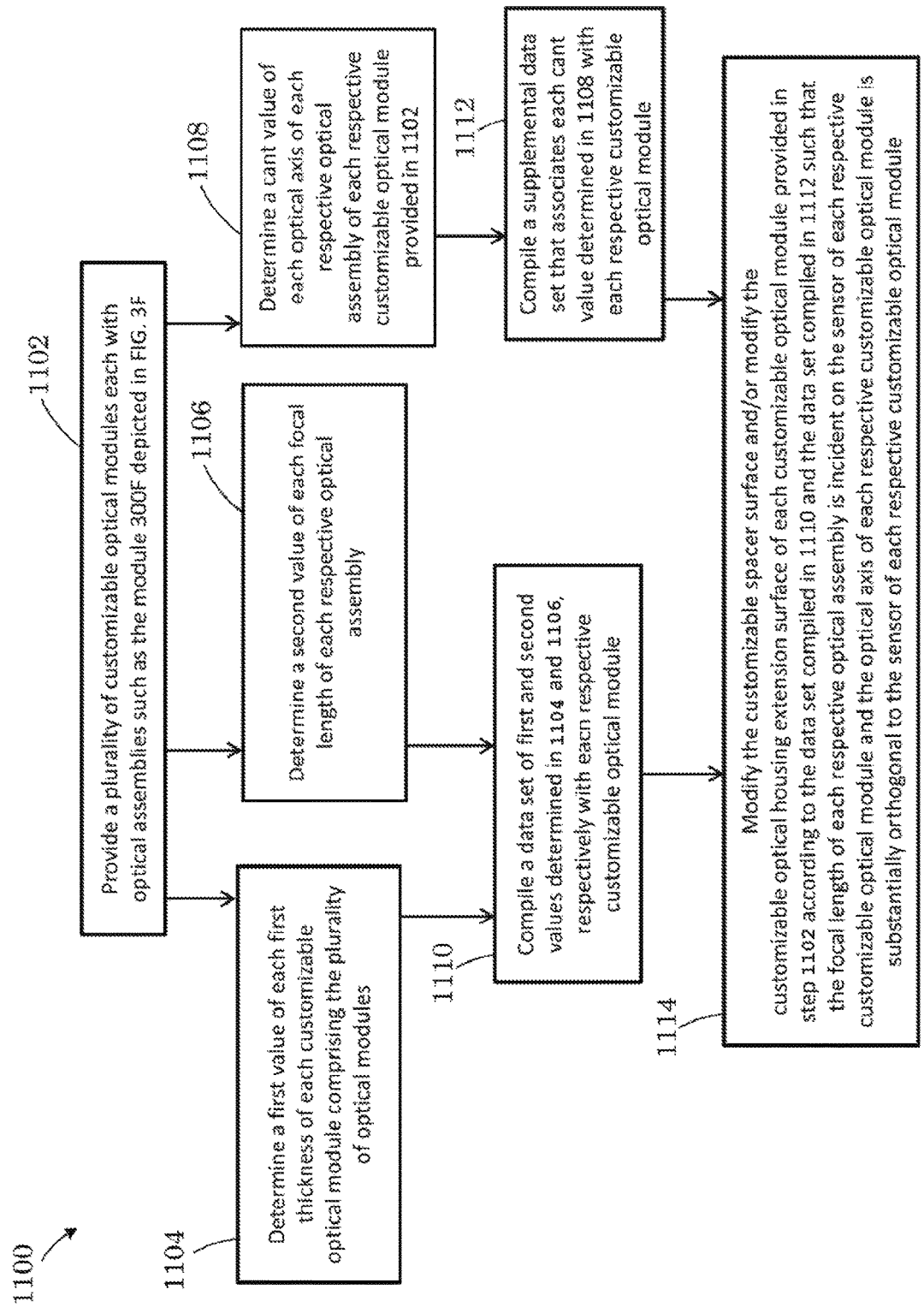

FIG. 11 depicts another example method 1100 of standardizing a plurality of customizable optoelectronic modules such as the customizable optoelectronic modules 300F as depicted in FIG. 3F. The method of standardizing a plurality of customizable optoelectronic modules 1100 includes a providing step 1102, a first determining step 1104, a second determining step 1106, a third determining step

1108, a first compiling step 1110, a second compiling step 1112, and a modifying step 1114.

The providing step 1102 includes providing a plurality of customizable optoelectronic modules for example as depicted in the figures above. Each customizable optoelectronic module within the plurality of customizable optoelectronic modules includes a substrate on which is electrically mounted a sensor, a cover having a first thickness disposed over the sensor, a customizable spacer assembly having a customizable spacer laterally surrounding a peripheral surface of the cover, and a spacer extension extending from the customizable spacer with a second thickness having a terminal end defining a customizable spacer surface, and an optical assembly including a plurality of optical elements mounted within an optical housing, wherein the optical assembly has a focal length and an optical axis and the optical housing includes a customizable optical housing extension extending from the optical housing with a third thickness having a terminal end defining a customizable optical housing extension surface. Further, the first determining step 1104 includes determining a first value of each first thickness of each customizable optoelectronic module within the plurality of optoelectronic modules. The first thickness can be determined optically, for example. The second determining step 1106 includes determining a second value of each focal length of each respective optical assembly. The focal length can be determined optically (e.g., via optical inspection methods). The third determining step 1108 includes determining a cant value for each optical axis of each respective optical assembly. The cant of each optical axis can be determined optically (e.g., via optical inspection methods). Further, the first compiling step 1110 includes compiling a data set of first and second values that associates each first and second values with each respective customizable optoelectronic module. The second compiling step 1112 includes compiling a supplemental data set that associates each cant value with each respective customizable optoelectronic module. Finally, the modifying step 1114 includes modifying the customizable spacer surface of each customizable optoelectronic module according to the data set and the supplemental data set such that the focal length of each respective optical assembly is incident on the sensor of each respective customizable optoelectronic module and the optical axis of each respective customizable optoelectronic module is substantially orthogonal to the sensor of each respective customizable optoelectronic module. The customizable spacer surface and/or the customizable optical housing extension surface can be machined, for example, by an automated dicing, cutting, or grinding machine. Further the data set may be compiled by an automated machine in some cases.

Although the steps described above and depicted in FIG. 5-FIG. 11 are described in a particular order, the order can be different in some implementations. Accordingly, other implementations are within the scope of the appended claims.

What is claimed is:

1. A method of standardizing a plurality of customizable optoelectronic modules, the method comprising:
   providing a plurality of customizable optoelectronic modules, wherein each customizable optoelectronic module includes a substrate on which is electrically mounted a sensor, a cover having a first thickness disposed over the sensor, a customizable spacer assembly having a customizable spacer laterally surrounding a peripheral surface of the cover, and a spacer extension extending from the customizable spacer with a second thickness having a terminal end defining a customizable spacer surface; and
   modifying the customizable spacer surface of each respective customizable optoelectronic module such that the sum of each second thickness and each respective first thickness is substantially equal to a first standard value, the first standard value being substantially the same for each customizable optoelectronic module.

2. The method of claim 1 including:
   measuring a respective value of each first thickness of each customizable optoelectronic module;
   compiling a data set of values, wherein the data set associates each first thickness with a respective one of the customizable optoelectronic modules; and
   modifying the customizable spacer surface of each respective customizable optoelectronic module according to the data set such that the sum of each second thickness and the respective first thickness is substantially equal to a first standard value, the first standard value being substantially the same for each of the customizable optoelectronic modules.

3. The method of claim 1 wherein modifying the customizable spacer surface includes cutting the spacer surface.

4. The method of claim 1 wherein modifying the customizable spacer surface includes grinding the spacer surface.

5. The method of claim 1 wherein modifying the customizable spacer surface includes dicing the spacer surface.

6. A method of standardizing a plurality of customizable optoelectronic modules, the method comprising:
   providing a plurality of customizable optoelectronic modules, wherein each customizable optoelectronic module includes a substrate on which is electrically mounted a sensor, a cover having a first thickness disposed over the sensor, a customizable spacer assembly having a customizable spacer laterally surrounding a peripheral surface of the cover, a spacer extension extending from the customizable spacer with a second thickness having a terminal end defining a customizable spacer surface, and an optical assembly including a plurality of optical elements mounted within an optical housing, wherein the optical assembly has a focal length and an optical axis; and
   modifying the customizable spacer surface of each customizable optoelectronic module such that the focal length of each respective optical assembly is incident on the sensor of each respective customizable optoelectronic module.

7. The method of claim 6 including:
   measuring a first value of the first thickness of each respective customizable optoelectronic module;
   measuring a second value of each focal length of each respective optical assembly;
   compiling a data set of the first and second values, wherein the data set associates each first and second value with a respective one of the customizable optoelectronic modules; and
   modifying the customizable spacer surface of each respective customizable optoelectronic module according to the data set such that the focal length of each respective optical assembly is incident on the sensor of the respective customizable optoelectronic module.

8. The method of claim 7 further comprising:
   determining a cant value for the optical axis of each respective optical assembly;

compiling a supplemental data set that associates each cant value with a respective one of the customizable optoelectronic modules; and modifying the customizable spacer surface of each customizable optoelectronic module according to the data set and the supplemental data set such that the focal length of each respective optical assembly is incident on the sensor of the respective customizable optoelectronic module, and the optical axis of each respective customizable optoelectronic module is substantially orthogonal to the sensor of the respective customizable optoelectronic module.

9. The method of claim 6 including:

measuring a respective value of each focal length of each optical assembly;

compiling a data set of values, wherein the data set associates each focal length with a respective one of the optoelectronic modules; and modifying the customizable spacer surface of each customizable optoelectronic module according to the data set such that the focal length of each respective optical assembly is incident on the sensor of the respective customizable optoelectronic module.

10. The method of claim 9 further comprising:

a.) determining a cant value for the optical axis of each respective optical assembly;

b.) compiling a supplemental data set that associates each cant value with a respective one of the customizable optoelectronic modules; and c.) modifying the customizable spacer surface of each customizable optoelectronic module according to the data set and the supplemental data set such that the focal length of each respective optical assembly is incident on the sensor of each respective customizable optoelectronic module and the optical axis of each respective customizable optoelectronic module is substantially orthogonal to the sensor of each respective customizable optoelectronic module.

11. The method of claim 6 wherein modifying the customizable spacer surface includes cutting the spacer surface.

12. The method of claim 6 wherein modifying the customizable spacer surface includes grinding the spacer surface.

13. The method of claim 6 wherein modifying the customizable spacer surface includes dicing the spacer surface.

14. A method of standardizing a plurality of customizable optoelectronic modules, the method comprising:

providing a plurality of customizable optoelectronic modules, wherein each customizable optoelectronic module includes a substrate on which is electrically mounted a sensor, a cover having a first thickness disposed over the sensor, a customizable spacer assembly having a customizable spacer laterally surrounding a peripheral surface of the cover, and a spacer extension extending from the customizable spacer with a second thickness having a terminal end defining a customizable spacer surface, and an optical assembly including a plurality of optical elements mounted within an optical housing, wherein the optical assembly has a focal length and an optical axis and the optical housing includes a customizable optical housing extension extending from the optical housing with a third thickness having a terminal end defining a customizable optical housing extension surface; and modifying the customizable spacer surface and/or modifying the customizable optical housing extension surface of each customizable optoelectronic module such that the focal length of each respective optical assembly is incident on the sensor of the respective one of the customizable optoelectronic modules.

15. The method of claim 14 including:

measuring a first value of the first thickness of each customizable optoelectronic module;

measuring a second value of the focal length of each respective optical assembly;

compiling a data set of first and second values that associates each first and second values with a respective one of the customizable optoelectronic modules; and modifying the customizable spacer surface and/or modifying the customizable optical housing extension surface of each customizable optoelectronic module according to the data set such that the focal length of each respective optical assembly is incident on the sensor of the respective one of the customizable optoelectronic modules.

16. The method of claim 15 further comprising:

determining a cant value for the optical axis of each respective optical assembly;

compiling a supplemental data set that associates each cant value with a respective one of the customizable optoelectronic modules; and modifying the customizable spacer surface of each customizable optoelectronic module according to the data set and the supplemental data set such that the focal length of each respective optical assembly is incident on the sensor of each respective customizable optoelectronic module and the optical axis of each respective customizable optoelectronic module is substantially orthogonal to the sensor of the respective customizable optoelectronic module.

17. The method of claim 14 wherein modifying the customizable spacer surface includes cutting the spacer surface.

18. The method of claim 14 wherein modifying the customizable spacer surface includes grinding the spacer surface.

19. The method of claim 14 wherein modifying the customizable spacer surface includes dicing the spacer surface.

* * * * *